United States Patent
Xiao et al.

(10) Patent No.: US 8,681,026 B2
(45) Date of Patent: Mar. 25, 2014

(54) DIGITAL TO ANALOG CONVERTER

(75) Inventors: Jinwen Xiao, Austin, TX (US); Pavel Konecny, San Jose, CA (US); Axel Thomsen, Austin, TX (US); Ka Y. Leung, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/408,173

(22) Filed: Feb. 29, 2012

(65) Prior Publication Data

US 2013/0222162 A1    Aug. 29, 2013

(51) Int. Cl.
  *H03M 1/06*    (2006.01)
(52) U.S. Cl.
  USPC .......................................... 341/118; 341/155
(58) Field of Classification Search
  USPC .......................................... 341/118, 120, 144
  See application file for complete search history.

(56) References Cited

U.S. PATENT DOCUMENTS

| | | | |
|---|---|---|---|
| 5,248,970 A * | 9/1993 | Sooch et al. | 341/120 |
| 6,191,715 B1 * | 2/2001 | Fowers | 341/120 |
| 6,208,190 B1 * | 3/2001 | Lukoff | 327/307 |
| 6,278,391 B1 * | 8/2001 | Walker | 341/118 |
| 6,597,300 B2 * | 7/2003 | Mori | 341/144 |
| 6,919,833 B2 * | 7/2005 | Mills | 341/144 |
| 7,791,519 B2 * | 9/2010 | Matsukawa et al. | 341/144 |
| 7,956,667 B2 * | 6/2011 | Ikedo et al. | 327/362 |

* cited by examiner

*Primary Examiner* — Peguy Jean Pierre
(74) *Attorney, Agent, or Firm* — Abel Law Group, LLP

(57) ABSTRACT

An input digital signal is converted to an analog signal using a main digital to analog converter (DAC) and a sub DAC. An offset value is subtracted from the input digital signal to generate an offset adjusted digital signal. The main DAC converts the offset adjusted digital signal to a first analog signal. A second digital signal is generated based on the offset value and a correction factor determined, at least in part, during calibration of the main DAC. The sub DAC converts the second digital to a second analog signal, which when combined with the first analog signal, provides an analog representation of the input digital signal.

20 Claims, 2 Drawing Sheets

DIGITAL TO ANALOG CONVERTER

BACKGROUND

1. Field of the Invention

This invention relates to digital to analog converters.

2. Description of the Related Art

Digital to analog converters (DACs) receive a digital signal and convert the digital signal to an analog signal. Digital signals may represent, e.g., audio, video, or control signals from a microcontroller, transmitted signal, or other source, that need to be converted to an analog voltage or current before being used. For example, the analog signals may be supplied to speakers, video displays, or any number of actuators or controllers.

SUMMARY

Accuracy of digital to analog converters is an important criterion for many types of systems. In addition, it can be important to consider ways to reduce space allocated to a DAC on an integrated circuit. However, there may be a tradeoff between accuracy and space. Thus, it is desirable to provide accurate conversion while reducing the amount of chip area required for implementing the digital to analog converter.

Accordingly, in one embodiment, a method is provided for converting a digital signal to an analog signal. The method includes receiving an input digital signal and subtracting an offset value from the input digital signal to generate an offset adjusted digital signal. The offset adjusted digital signal is supplied to a first digital to analog converter, which generates a first analog signal corresponding to the offset adjusted digital signal. A second digital signal is generated based on the offset value and a correction factor. The second digital signal is supplied to a second digital to analog converter, which generates a second analog signal corresponding to the second digital signal. The combination of the first and second analog signals provides an analog representation of the input digital signal.

In another embodiment an integrated circuit is provided that includes a circuit to subtract an offset value from an input digital signal to generate an offset adjusted input digital signal. A first digital to analog converter is coupled to receive the offset adjusted digital signal and supply a first analog signal corresponding to the offset adjusted digital signal. A correction circuit generates a second digital signal based on the offset value and a correction factor, the correction factor to correct for inaccuracy in the first digital to analog converter. A second digital to analog converter is coupled to receive the second digital signal and supply a second analog signal corresponding to the second digital signal. A combination of the first and second analog signals provides an analog representation of the input digital signal.

In another embodiment an integrated circuit includes a first digital to analog converter to generate a first analog signal from a first digital signal. A second digital to analog converter generates a second analog signal from a second digital signal to correct for error in the first analog signal. The integrated circuit may further include a circuit to receive a third digital signal and to generate the first digital signal based on the third digital signal and an offset to the third digital signal. The first and second analog signals are used to create an analog representation of the third digital signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
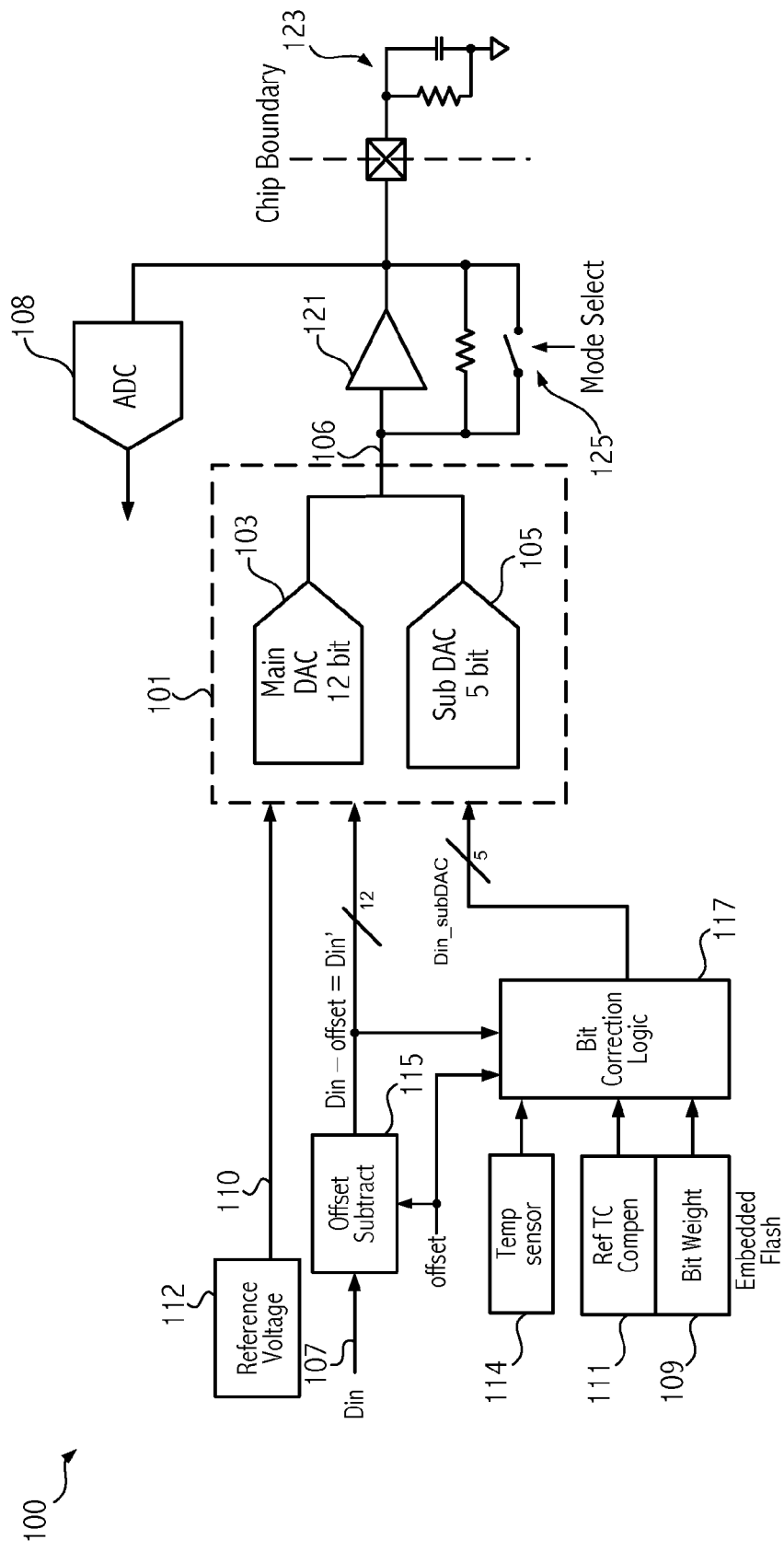
FIG. 1 illustrates a high level block diagram of an embodiment of the invention.

Referring to FIG. 1, illustrated is an exemplary high level block diagram of an embodiment which provides a 12 bit calibrated DAC 100. In the exemplary embodiment, the DAC 101 includes a 12 bit main DAC 103 and a 5 bit sub DAC 105. Of course the size of the main DAC and sub DAC are exemplary and other sizes may be utilized according to application requirements. The main DAC and sub DAC may be current core in nature as explained further herein. In order to save area, in an embodiment, the main DAC may be matched to, e.g., 8 or 9 most significant bits. The sub DAC may be a 5 bit linear DAC that matches to the least significant bit (LSB) of the 12 bit DAC. Because the sub DAC full range is very small, the area of the sub DAC is still very small in such an embodiment.

Figure 2A:
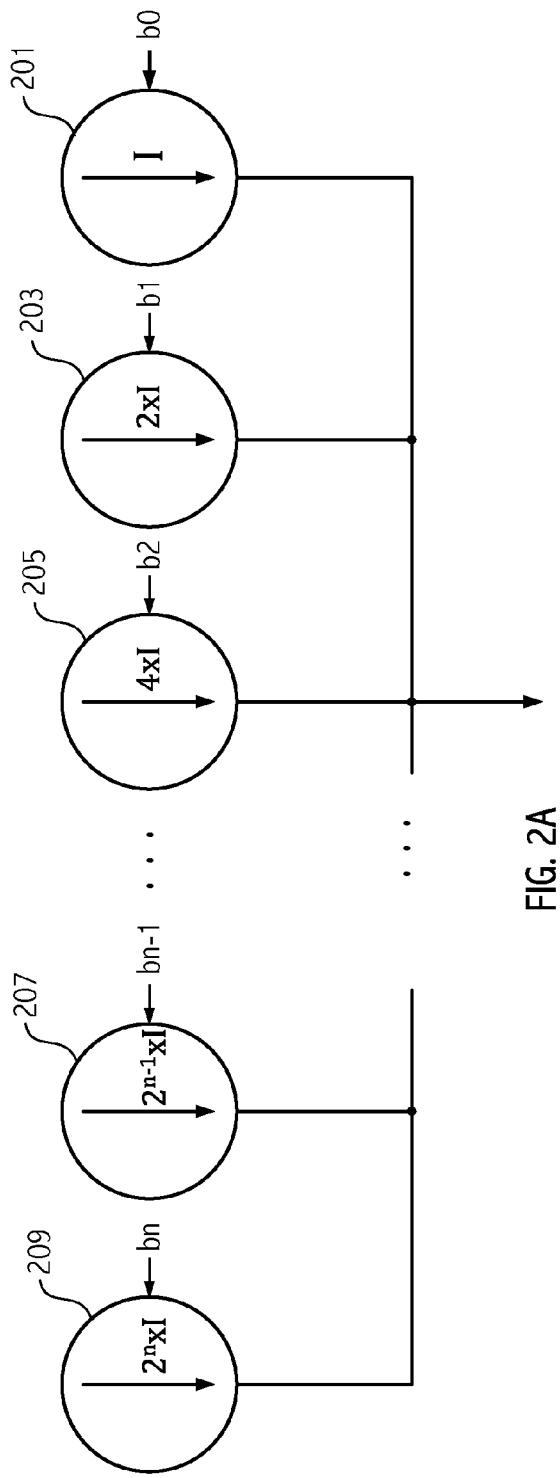
FIG. 2A illustrates a high level block diagram of a current-based analog to digital converter.
Figure 2B:
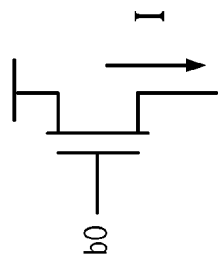
FIG. 2B illustrates a circuit that forms at least a part of one of the current stages of the analog to digital converter.

Before describing the operation of the calibrated DAC 100, FIG. 2A illustrates a DAC according to one embodiment in which weighted current sources 209, 207, 205, 203 and 201 are used to convert an input digital signal bn, bn−1, b2, b1, b0, to a current. For example, the first current source 201 may be formed using one transistor and provide one microamperes (µA) of current in response to b0 being a digital "1". FIG. 2B illustrates how b0 may be utilized by a simple one transistor current source. The current source 203 may be formed of two transistors and provide 2 µA in response to b1 being a digital "1". The current source 205 may be formed of four transistors and provide 4 µA of current in response to b2 being a digital "1". Thus, the current sources provide weighted currents corresponding to the value of the digital word. Note that the current sources may be weighted by having larger transistors rather than a larger number of transistors, or both. However, errors can be associated with providing weighted currents. One source of error is proportional to $(1/\sqrt{\text{area}})$, where "area" refers to area of the transistor(s). The area of a transistor is determined, at least in part, by its width (W) and length (L).

One measure of accuracy in a DAC is differential non-linearity (DNL), which reflects a difference between an ideal step size and an actual step size for the DAC. For a 12 bit DAC, there are 4096 steps. That is, an increase in the digital code should never result in a decrease in output current from the digital to analog converter. To provide sufficient accuracy to provide a maximum DNL <1 LSB, each weighted stage needs to be matched in terms of error. For a 12 bit DAC, that can be very expensive in terms of the integrated circuit area that needs to be dedicated to the transistors of the DAC. The error associated with a DAC can be understood by way of example. Assume a 3 bit DAC with a certain error and a certain total area. To achieve a 4 bit DAC having the same error the total area needs to be increased by four. Typically, in a given DAC, one transistor unit (area=A) forms b0, b1 is formed of 2 transistor units (area=2*A), bit b3 is formed of 4 transistor units (area=4*A). Note that error associated with an adjacent bit does not have to be the same. For example the b0 bit can have 90% error (0.9 LSB) and DNL can still be <1 LSB. However, if b1 has a 90% error, that would equate to an error of 1.8 LSB, because it has a weight that is twice as large. Thus, the area of the MSB determines the maximum error and consequently the required area A of one unit.

Referring back to FIG. 1, rather than provide a well-matched 12 bit DAC, in an embodiment, there are twelve weighted current sources in the DAC 101, but the matching is limited to provide a maximum DNL <7 LSBs (9 bit matching). Referring to the example above, where the current source for the LSB provides 1 μA, a maximum DNL of 7 LSBs would imply a maximum DNL of 7 μA. Of course, the actual current associated with the LSB depends on the application requirements such as speed and power for the DAC. Limiting matching to a certain accuracy, e.g., having a DNL of 7 LSBs, allows the area dedicated to the main DAC 103 to be significantly smaller than a well-matched DAC. However, that results in errors in the conversion of main DAC 103. The sub DAC 105 provides a mechanism to correct those errors. The sub DAC 105 is small compared to the main DAC. In an embodiment, the sub DAC is well-matched (e.g., maximum DNL <1 LSB), but being a five bit DAC, is small compared to the 12 bit main DAC. Note that the cost of going from matching, e.g., at 9 bits to matching at 12 bits for the main DAC, could require an increase in area of 8 times. Thus, utilizing the main DAC matched to 8 or 9 bits in combination with a well-matched sub DAC of 5 bits results in a significant savings in terms of area required for the DAC. In addition, a single DAC with excellent matching requires a large transistor area, which results in a relatively large capacitance. That large capacitance negatively impacts the speed of conversion. However, using the main DAC and the sub DAC results in two small DACs working in parallel, which operate faster than the single large well-matched DAC. Thus, there are improvements in speed of conversion as well as reduced area required for conversion.

If the main 12 bit DAC is matched to 8 or 9 bits in order to minimize block area, that results in the need for factory calibration to obtain a level of linearity corresponding to a well-matched 12 bit DAC. In an embodiment, the calibration is performed bit-by-bit. For example, with an input code Din=b'1000_0000_0000 on node 107, the output of the DAC 103 can be converted back to digital for comparison. In an embodiment an on-chip ADC 108 is utilized to quantize the main DAC 103 output. In an embodiment, ADC 108 is a successive approximation register (SAR) ADC. Alternatively, the analog voltage can be compared to an analog voltage off chip and the difference converted to digital or an off-chip analog to digital converter may be utilized. Assume the input is the binary value b'1000_0000_0000 and the measured output is Dout=b'1000_0000_0000_0111. Then the weight of main DAC MSB may be determined as Dout/Din. Similarly, the other bits of the DAC can be calibrated. That is, the input value Din is successively set to the binary values b'0100_0000_0000, b'0010_0000_0000, . . . b'0000_0000_0010, b;0000_0000_0001 to calibrate each successive bit until the respective weight of each bit is determined. The weights may then be stored in the embedded memory 109. The memory 109 may be implemented as non-volatile memory (e.g., one-time programmable (OTP) memory or flash memory) if the calibration is performed during a factory calibration. In an embodiment, the calibration is performed on power-up, and the memory 109 may therefore be dynamic memory. Note that the offset subtract may be inactive during calibration, e.g., set to 0.

The DACs 103 and 105 utilize an input reference voltage 110. In an embodiment, the input reference voltage of the DAC is directly from a band gap circuit 112 and therefore may contain a significant temperature coefficient (TC) that causes the reference voltage to change in response to temperature change. In order to address possible variations in the reference voltage due to temperature change, a TC compensation code based on calibration of each part or a subset of parts may be stored in memory 111. In order to address possible variations in the reference voltage due to temperature change, an embodiment utilizes an on-chip temperature sensor 114 to sense the temperature change and notify the correction logic 117 to fetch band gap reference TC compensation code from memory 111. Compensation for temperature may be implemented by multiplying the reference TC compensation code with the input data Din on node 107 before applying bit-by-bit correction to Din based on the calibration weights. After applying TC compensation, the DAC reference appears to be having a very small temperature coefficient (e.g., less than 15 ppm/DC).

During run time, the DAC needs bit-by-bit correction according to the weight of each bit determined during the calibration, and this correction is carried out in the digital domain. For every DAC input code Din supplied on node 107, subtract logic 115 subtracts a small and fixed digital offset to generate an offset corrected Din', namely, Din'=Din−offset. The offset value may be stored in the memory 109. Eventually the digital offset will be accounted for along with other corrections including the calibration error and the TC error using the sub DAC 105. The application of the digital offset allows the use of a simple correction algorithm and reduced digital area. In order to simplify the sub DAC and ensure that the correction is always positive, the offset is selected to be larger than the correction factors determined by the calibration for the main DAC and/or associated with the reference voltage of the DAC.

Correction logic 117 is used to generate a digital signal for sub DAC 105 that corrects for the offset, the error in the main DAC determined during calibration, and the temperature sensitivity of the reference voltage. Din' is supplied to the main DAC 103, which converts Din' to an output current with a bit error previously determined during calibration. In order to account for the bit error in the main DAC 103 and the additional error due to the offset, the offset has to be added back to whatever correction is determined based on the weights. Thus, $$Din_{subDAC} = \text{error(from main DAC)} + \text{offset} + \text{TC comp}, \quad (\text{eq.1})$$

where the error from the main DAC may be positive or negative. In addition, $D_{in\_subDAC}$ may be further adjusted by including a TC compensation value based on the sensed temperature. The TC compensation value may also be positive or negative. The offset value is set to be larger than the magnitude of any expected error from the combination of main DAC error determined during calibration and the TC compensation.

In an exemplary embodiment, the correction logic determines the error in the current generated by the main DAC 103 based on Din' (offset corrected Din). The error may be calculated in the digital domain in the correction logic 117 as $$\text{error} = \left(\sum_{i=0}^{n} b_i' \cdot w_i \cdot 2^i\right), \quad \text{(eq. 2)}$$

where $b_i'$ is the bit value for Din' and $w_i$ is the weight associated with that bit from calibration and stored in bit weight memory 109, n is the number of bits in the digital word (e.g., n=11 for a 12 bit DAC). The input to the subDAC, $D_{in\_subDAC}$ may thus be determined in bit correction logic 117 in the digital domain.

Describing the error correction provided by sub DAC 105 in another way, any error determined due to inaccuracies in the DAC conversion caused by temperature variations, mismatches in the current sources, or from any other source, can be combined. That error can be positive or negative. To that error is added the offset, which is larger than the magnitude of the error to ensure that current is added to the current generated by the main DAC and never has to be subtracted. Thus, sub DAC 105 generates a correction current that is combined at node 106 with the current generated by the main DAC 103. That combined current provides an analog representation of Din supplied on node 107.

The DAC can be configured into voltage mode or current mode. In voltage mode, an output buffer 121 drives the off-chip load 123. In current mode, the output of the current DAC is directly connected to the chip boundary by closing mode select switch 125 and disabling output buffer 121.

In an embodiment, the full range of the sub DAC covers twice the maximum variation of the main DAC, which may be <1%. While the DAC area is reduced by using the main DAC in combination with the sub DAC while maintaining the accuracy of a 12 bit well-matched DAC, there is a cost in terms of digital logic to implement the correction, subtract the offset, and store the weights. The improvement in digital circuit density scales well with process improvements, while analog circuit matching may show more modest scaling improvements. Thus, moving certain portions of the conversion process into digital from the analog to reduce analog area, increase speed, and maintain accuracy can be advantageous, particularly for deep submicron processes.

Figure 3:
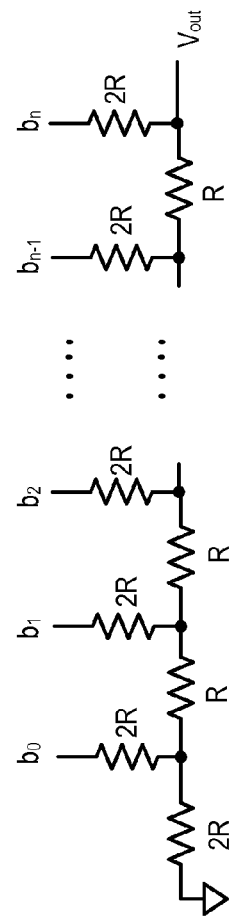
FIG. 3 illustrates an R2R resistor ladder that may be used as a digital to analog converter according to an embodiment of the invention.

While the main DAC and subDAC may be implemented as weighted current sources, in other embodiments, the main DAC and sub-DAC may be implemented differently. For example, referring again to FIG. 1, the main DAC 103 may be implemented as an R2R resistor ladder such as shown in FIG. 3 and sub-DAC 105 as a weighted current DAC. In addition, other types of DACs may be utilized for the main and subDAC according to the suitability for the particular implementation.

The description of the invention set forth herein is illustrative, and is not intended to limit the scope of the invention as set forth in the following claims. In addition, other variations and modifications of the embodiments disclosed herein, may be made based on the description set forth herein, without departing from the scope of the invention as set forth in the following claims.

What is claimed is:

1. A method of converting a digital signal to an analog signal comprising:
    receiving an input digital signal;
    subtracting an offset value from the input digital signal to generate an offset adjusted digital signal;
    supplying the offset adjusted digital signal to a first digital to analog converter and generating a first analog signal corresponding to the offset adjusted digital signal;
    generating a second digital signal based on the offset value and a correction factor; and
    supplying the second digital signal to a second digital to analog converter and generating a second analog signal corresponding to the second digital signal.

2. The method as recited in claim 1 further wherein the first analog signal is a first current and the second analog signal is a second current and the method further comprises combining the first current and the second current to generate a third current corresponding to the input digital signal.

3. The method as recited in claim 2 further comprising selectively supplying as an output corresponding to the input digital signal, the third current or a voltage generated using the third current, according to a select signal determining whether the output is in current mode or voltage mode.

4. The method as recited in claim 2 further comprising supplying the first current as a combination of currents from respective current sources, at least some of which current sources are unmatched.

5. The method as recited in claim 1 further comprising determining the correction factor based, at least, on calibration of the first digital to analog converter and the offset value.

6. The method as recited in claim 5 further comprising including in the correction factor a compensation value based on temperature.

7. The method as recited in claim 1 wherein the offset value is always larger than the correction factor.

8. The method recited in claim 1 wherein the correction factor is determined, at least in part, using an error term associated with the first digital to analog converter, the error term determined as $$\left(\sum_{i=0}^{n} b_i' \cdot w_i \cdot 2^i\right),$$

where $b_i'$ is a bit of the offset adjusted digital signal, and $w_i$ is a weight assigned to each respective bit.

9. The method as recited in claim 8 further comprising determining the weight $w_i$ during calibration of the first digital to analog converter.

10. The method as recited in claim 9 wherein determining the weight $w_i$ during calibration further comprises:
    generating a calibration analog value for a digital calibration value using the first digital to analog converter;
    supplying the calibration analog value to an analog to digital converter to generate a calibration digital signal; and
    generating the weight $w_i$ based on the digital calibration value and the calibration digital signal.

11. The method as recited in claim 10 further comprising determining the weight $w_i$ for each particular bit according to respective ratios of the calibration digital signal to the digital calibration value for each of the bits.

12. The method as recited in claim 1 further comprising applying a correction to correct for variation in a reference voltage due to change in temperature, as part of determining the correction factor.

13. An apparatus comprising:
    a circuit to subtract an offset value from an input digital signal to generate an offset adjusted digital signal;
    a first digital to analog converter coupled to receive the offset adjusted digital signal and supply a first analog signal corresponding to the offset adjusted digital signal;
    a correction circuit to generate a second digital signal based on the offset value and a correction factor, the correction factor to correct for inaccuracy in the first digital to analog converter; and a second digital to analog converter coupled to receive the second digital signal and supply a second analog signal corresponding to the second digital signal.

14. The apparatus as recited in claim 13 further comprising:

a temperature sensor; and wherein the correction factor is determined, in part, according to a temperature sensed by the temperature sensor to correct for variations due to temperature in a reference voltage supplied to the first digital to analog converter.

15. The apparatus as recited in claim 13 wherein the first analog signal is a first current and the second analog signal is a second current and a combination of the first and second current is a third current providing an analog representation of the input digital signal.

16. The apparatus as recited in claim 13 further comprising:

a selector circuit that supplies an output node with the third current or a voltage corresponding to the third current, according to a mode select signal.

17. The apparatus as recited in claim 13 wherein the correction circuit generates the correction factor based on a calibration of the first digital to analog converter.

18. The apparatus as recited in claim 13 further comprising:

an analog to digital converter coupled to receive from the first digital to analog converter during calibration a calibration analog signal corresponding to a digital calibration value supplied to the first digital to analog converter and to supply a second digital signal corresponding thereto; and wherein the correction factor is based on the digital calibration value and the second digital signal.

19. An integrated circuit comprising:

a first digital to analog converter to generate a first analog signal from a first digital signal;

a second digital to analog converter generate a second analog signal from a second digital signal to correct for error in the first analog signal;

a circuit to receive a third digital signal and to generate the first digital signal based on the third digital signal and an offset to the third digital signal; and and wherein the first and second analog signals are used to create an analog representation of the third digital signal.

20. The integrated circuit as recited in claim 19 further comprising a correction circuit to generate the second digital signal based on the offset and a correction factor.

* * * * *